United States Patent
Yamada et al.

(10) Patent No.: US 7,180,196 B2
(45) Date of Patent: Feb. 20, 2007

(54) SEMICONDUCTOR DEVICE MOUNTING METHOD, SEMICONDUCTOR DEVICE MOUNTING STRUCTURE, ELECTRO-OPTICAL DEVICE, ELECTRO-OPTICAL DEVICE MANUFACTURING METHOD AND ELECTRONIC DEVICE

(75) Inventors: Kazuyuki Yamada, Matsumoto (JP); Takeshi Ashida, Matsumoto (JP); Masahiko Nakazawa, Hata-machi (JP); Masanori Yumoto, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/644,603

(22) Filed: Aug. 20, 2003

(65) Prior Publication Data
US 2004/0094846 A1 May 20, 2004

(30) Foreign Application Priority Data
Aug. 21, 2002 (JP) .............................. 2002-240776
Jul. 15, 2003 (JP) .............................. 2003-197276

(51) Int. Cl.
*H01L 23/48* (2006.01)
*H01L 23/485* (2006.01)
*H01L 23/498* (2006.01)

(52) U.S. Cl. .............................. 257/782; 257/E23.021; 257/E23.06; 257/785; 257/690

(58) Field of Classification Search ........ 257/E23.021, 257/E23.06, 782, 785, 690, 778, 777, 780, 257/784, 786, 734, 787, 728; 29/837, 740
See application file for complete search history.

(56) References Cited

U.S. PATENT DOCUMENTS

| | | | |
|---|---|---|---|
| 5,214,308 A | | 5/1993 | Nishiguchi et al. |
| 5,457,879 A | * | 10/1995 | Gurtler et al. .............. 438/108 |
| 5,592,365 A | | 1/1997 | Sugimoto et al. |
| 6,137,063 A | | 10/2000 | Jiang |
| 6,172,422 B1 | | 1/2001 | Chigawa |
| 6,356,333 B1 | | 3/2002 | Uchiyama |
| 6,555,415 B2 | * | 4/2003 | Hedler .............. 438/108 |
| 6,713,844 B2 | * | 3/2004 | Tatsuta et al. .............. 257/629 |
| 2002/0089057 A1 | | 7/2002 | Ikegami |

FOREIGN PATENT DOCUMENTS

| | | |
|---|---|---|
| JP | 60-49638 | 3/1985 |
| JP | 8-031864 | 2/1996 |

(Continued)

OTHER PUBLICATIONS

NA84035027 "Low Inductance Chip Tester Interposers" IBM Technical Disclosure Bulletin, Mar. 1984, US vol. # 26, Issue # 10A, p. # 5027-5030; Publication date Mar. 1, 1984.*

Communication from Chinese Patent Office regarding counterpart application.

(Continued)

*Primary Examiner*—Alexander Oscar Williams
(74) *Attorney, Agent, or Firm*—Harness, Dickey & Pierce, P.L.C.

(57) ABSTRACT

A wiring terminal is formed on a wiring substrate, and an electrode is formed on a semiconductor device. The width of the wiring terminal is smaller than the width of the electrode. When the semiconductor device is mounted on the wiring substrate, the wiring terminal becomes embedded in the electrode due to applied pressure.

2 Claims, 11 Drawing Sheets

FOREIGN PATENT DOCUMENTS

| | | |
|---|---|---|
| JP | 09-260424 | 10/1997 |
| JP | 11-251363 | 9/1999 |
| JP | 2001-42785 | 2/2001 |
| JP | 2001-223243 | 8/2001 |

OTHER PUBLICATIONS

Communication from European Patent Office regarding counterpart application.

* cited by examiner

F I G. 7
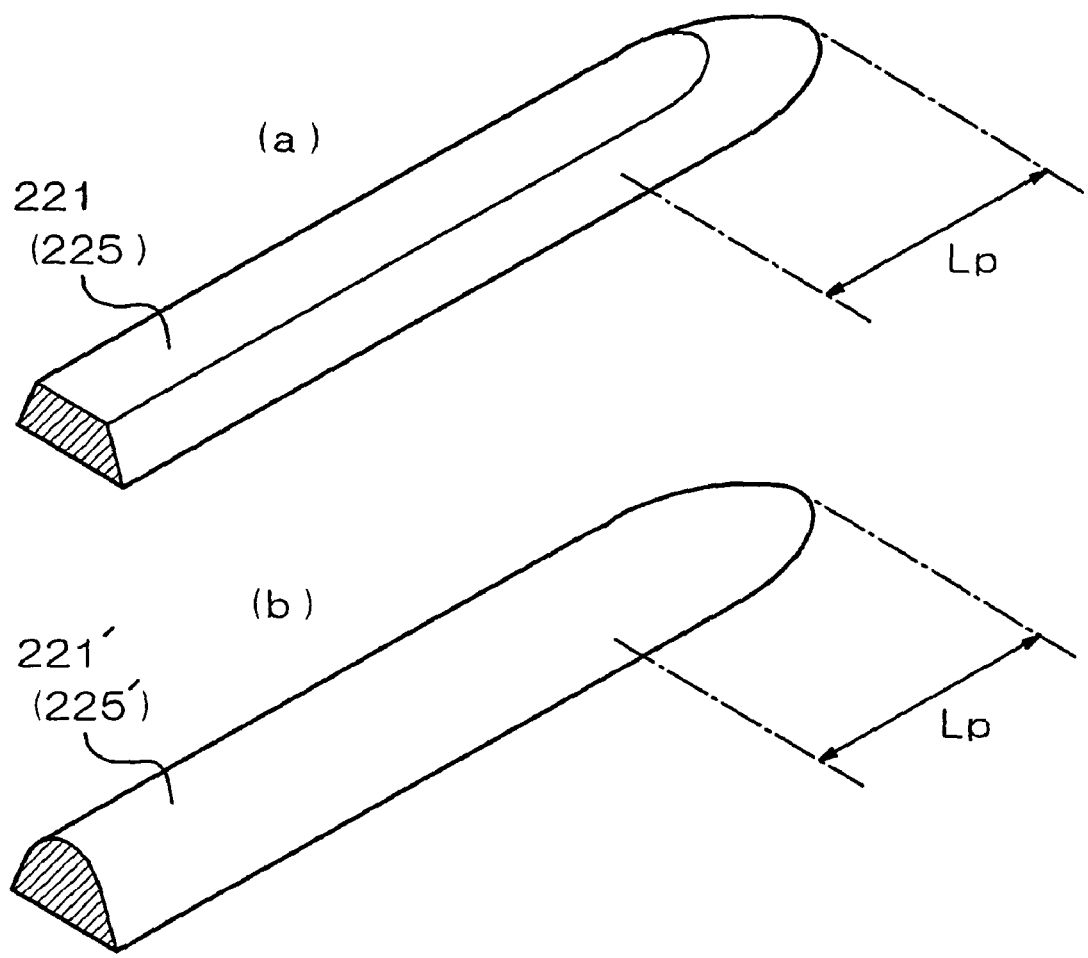

PRIOR ART

PRIOR ART

SEMICONDUCTOR DEVICE MOUNTING METHOD, SEMICONDUCTOR DEVICE MOUNTING STRUCTURE, ELECTRO-OPTICAL DEVICE, ELECTRO-OPTICAL DEVICE MANUFACTURING METHOD AND ELECTRONIC DEVICE

BACKGROUND OF THE INVENTION

1. Field of the Invention

The present invention relates to a semiconductor device mounting method, a semiconductor device mounting structure, an electro-optical device and an electronic device, and an electro-optical device manufacturing method, and in particular to a method for directly mounting a semiconductor device on a substrate and a semiconductor device mounting structure on a substrate.

2. Related Art

There is a method, commonly called flip-flop mounting or the like, for mounting a semiconductor device directly on a substrate. This mounting method is one in which electrodes are disposed on a semiconductor device (bare chip), wiring terminals are formed on a substrate, and the electrodes and the wiring terminals are brought into direct conductive contact without the intervention of wires or the like. In this method, electrodes having a protruding shape called "bump electrodes" are often formed on the semiconductor device, and these protruding electrodes are either directly brought into contact with the wiring terminals or brought into contact with the wiring terminals via a conductive paste or a conductive film.

As one example of the above-described semiconductor mounting structure, for example, in liquid crystal display devices that are one type of electro-optical device, there are cases where a wiring substrate such as a flexible printed circuit (FPC) is connected to a liquid crystal panel and a semiconductor device (bare chip), in which a liquid crystal drive circuit and the like are integrated, is mounted on the wiring substrate. FIG. 10 is a perspective view illustrating positional relations of a semiconductor device 130, in a case where the semiconductor device 130 is mounted on a wiring substrate 120 in such a liquid crystal display device, electrodes 131 and 135 disposed on the semiconductor device 130 and wiring terminals 121 and 125 formed on the wiring substrate 120. In this case, the electrodes 131 and 135 are respectively arranged at a predetermined pitch, and the wiring terminals 121 and 125 are arranged and formed so as to correspond to the formed pitch of the electrodes 131 and 135.

The semiconductor device 130 is mounted on the wiring substrate 120 by applying heat and pressure thereto via an anisotropic conductive film. FIG. 11 is an enlarged cross-sectional view showing detailed portions of this mounting structure. The anisotropic conductive film 133 is one where microscopic conductive particles 133a (e.g., particles where a conductive layer is formed on the surfaces of metal particles or insulating particles) are dispersed in a base material constituted by an insulating resin. The semiconductor device 130 is pressured and adhered onto the wiring substrate 120 via the anisotropic conductive film 133, and heat and pressure are applied thereto by an unillustrated pressurizing and heating head. Thus, the base material is temporarily softened and, as shown in FIG. 11, the electrodes 131 and 135 and the wiring terminals 121 and 125 are brought into conductive contact with the conductive particles sandwiched therebetween. Thereafter, the base material is hardened, whereby the state illustrated in the figure is fixed and the conductively connected state is maintained.

However, in recent years, there has been an increase in the number of terminals and intervals between the terminals are being narrowed in accompaniment with the complication of electronic circuits and improvements in the degree of integration of semiconductor devices. For example, in the aforementioned liquid crystal display devices, progress is being made in raising the fineness of displays, and color displays are becoming common even in portable small panels. Thus, the number of display pixels is increasing, the number of wiring terminals of wiring substrates and the number of electrodes of semiconductor devices are being increased in accompaniment therewith, and the intervals formed therebetween are being narrowed.

In such circumstances, it becomes difficult to sufficiently ensure the widths and intervals of the wiring terminals 121 and 125 of the wiring substrate 120 and the electrodes 131 and 135 of the semiconductor device 130. Thus, defects in the conductive contact between the wiring terminals and the electrodes, and short circuit defects between adjacent wiring terminals or electrodes increase, the reliability of conductively joined portions of the semiconductor mounting structure drops, and product yield deteriorates.

In view of this, the present invention solves these problems, and it is an object thereof to provide a new semiconductor device mounting method, a semiconductor device mounting structure, an electro-optical device and an electronic device, and an electro-optical device manufacturing method that can improve the reliability of conductively joined portions even when the numbers of wiring terminals and electrodes are increased and intervals therebetween are narrowed.

SUMMARY

In order to solve the above-described problems, a semiconductor device mounting method of the present invention is a mounting method in which a semiconductor device having an electrode thereon is mounted on a substrate having a wiring terminal thereon, wherein the width of one of the electrode and the wiring terminal is formed smaller than the width of the other, and pressure is mutually applied to the semiconductor device and the substrate so that the one of the electrode and the wiring terminal becomes embedded in a surface of the other.

Also, a semiconductor device mounting method of the present invention is a mounting method in which a semiconductor device having an electrode is mounted on a substrate having a wiring terminal, wherein the width of one of the electrode and the wiring terminal is formed smaller than the width of the other, the material of the one of the electrode and the wiring terminal has a high hardness, and pressure is mutually applied to the semiconductor device and the substrate.

Usually, when the width and interval of an electrode and a wiring terminal becomes smaller as a result of an increase in the degree of integration in a semiconductor device, it becomes easy for conductive defects and short circuit defects to occur. However, in the present invention, the width of one of the electrode and the wiring terminal is formed smaller than the width of the other, and the one is embedded in the other. Thus, it becomes possible to reliably obtain a conductive connection state and conductive defects are reduced because the contact surface area of conductively joined portions is increased. Additionally, by making the width of the one smaller, it becomes possible to also reduce short-circuit defects.

The width of the one (e.g., the wiring terminal) is preferably within the range of 10 to 60% of the width of the other (e.g., the electrode). When the width is less than this range, the absolute conductive contact area is reduced and it may become difficult to be able to obtain a stable conductive connection. When the width exceeds this range, it may become difficult for the one to be embedded in the other, it may become easy for the shape of the other to collapse due to the embedding, and reproducibility and stability of the joint structure of the conductively joined portions may drop.

When the electrode and the wiring terminal are both disposed as a plurality of members, the widths of all of the one conductively connected to the other are preferably formed to be substantially the same. By forming the widths of all of the one (e.g., the wiring terminal) conductively connected to the other (e.g., the electrode) to be substantially the same, irregularities in embedding resistance in each conductively joined portion can be reduced. Thus, it becomes difficult for a partial contact state at the time pressure is applied to arise, and a substantially uniform pressure is applied to the joint portions of all the electrodes and the wiring terminals. Thus, irregularities in the conductive state or embedded state in the conductively joined portions can be reduced, and it becomes possible to increase the reliability of the conductively joined portions.

Moreover, it is preferable to form, in the other of the wiring terminal and the electrode (e.g., the electrode) a recessed portion that has a width substantially corresponding to the width of the one (e.g., the wiring terminal), and to join the other to the one so that the recessed portion corresponds to the one. Thus, it becomes easier for the one to be embedded in the other.

Another semiconductor device mounting method of the present invention is a mounting method in which a semiconductor device having an electrode is mounted on a substrate having a wiring terminal, wherein the width of the wiring terminal is formed smaller than the width of the electrode, and pressure is mutually applied to the semiconductor device and the substrate so that the wiring terminal becomes embedded in a surface of the electrode.

Yet another semiconductor device mounting method of the invention is a mounting method in which a semiconductor device having an electrode is mounted on a substrate having a wiring terminal, wherein the width of the wiring terminal is formed smaller than the width of the electrode, the wiring terminal is formed of a material having a higher hardness than that of the electrode, and pressure is mutually applied to the semiconductor device and the substrate.

Usually, in comparison to a semiconductor device that is manufactured using a microfabrication technique in a common manner, wiring and wiring terminals on a substrate are formed by a photolithographic technique or a plating process of a relatively large dimension. Thus, in order to prevent short-circuit defects and the like, it is necessary to ensure that wiring intervals are large in comparison to electrode intervals of a semiconductor device. However, in the present invention, particularly because the width of the wiring terminal is formed smaller than the width of the electrode, it becomes possible to reduce conductive defects and short-circuit defects overall in comparison to a case where it is configured in the opposite manner (when the width of the electrode is made smaller than the width of the wiring terminal).

In this case, the wiring terminal is preferably configured so as to extend from in front of the electrode to as far as a position crossing the electrode. Because side etching easily arises at a leading end portion of the wiring terminal at the time of patterning of the wiring pattern, a shape difference with a regular cross-sectional shape becomes large, irregularities in the cross-sectional shape become large, and the width of the leading end portion also becomes smaller towards the leading end. Thus, as described above, by configuring the wiring terminal so as to extend from in front of the electrode to as far as a position crossing the electrode, it becomes possible to reduce irregularities in the dimension and sagging of the shape of the conductively connected site with respect to the electrode, whereby the reliability of the conductively joined portion can be improved. Also by configuring the wiring terminal in this manner, the margin of positional displacement between the electrode and the wiring terminal seen from the direction in which the wiring terminal extends can be increased, whereby conductive defects can be reduced. Here, when the width of the wiring terminal is about 10 to 20 μm, it is preferable for a length, crossing over from a region where the wiring terminal overlaps the electrode, to be about 5 to 10 μm.

Also, it is preferable for microscopic conductive particles to be intervened between the electrode and the wiring terminal and for pressure to be mutually applied to the semiconductor device and the substrate. By intervening microscopic conductive particles between the electrode and the wiring terminal, the joint strength (peel strength) between the electrode and the wiring terminal can be raised by an embedding or an anchor effect of the conductive particles, and the conductive contact area can be substantially increased, whereby the reliability of the conductive connection structure can be further improved. As the microscopic conductive particles, metal particles, such as Ni particles, or particles where a conductive layer (plate layer, etc.) is formed on the surfaces of synthetic resin particles, can be used. The size of the conductive particles is preferably about 0.1 to 5 μm. Here, the conductive particles preferably have a hardness that is higher than that of either the electrode or the wiring terminal. Thus, the conductive particles can be embedded in one of the electrode and the wiring terminal and it becomes possible for an anchor effect to be exhibited. In particular, an embedded state with respect to the other of the wiring terminal and the electrode can be formed due to the hardness being higher than that of the other (e.g., the electrode). Here, the conductive particles may have a hardness that is higher than that of the one of the wiring terminal and the electrode (e.g., the wiring terminal).

Moreover, it is preferable to dispose an adhesive between the semiconductor device and the substrate and to harden the adhesive in a pressurized state. By disposing an adhesive between the semiconductor device and the substrate and hardening the adhesive in a pressurized state (i.e., a state in which pressure is mutually applied to the semiconductor device and the substrate), the embedded state between the wiring terminal and the electrode can be maintained by the adhesive, whereby the reliability of the conductively joined portions can be further raised. Examples of the structure for adhering the semiconductor device and the substrate using an adhesive in this manner include a structure using, in combination with the conductive particles, an anisotropic conductive film (ACF) and an anisotropic conductive paste where the conductive particles are dispersed in an insulating base material (the adhesive). Other examples include an insulating resin joined structure such as an NCF (Non-Conductive Film) joined structure or an NCP (Non-Conductive Paste) joined structure where, in a state where the electrode and the wiring terminal are directly joined together, a vicinity thereof is hardened with the adhesive (insulating resin).

Next, a semiconductor device mounting structure of the present invention includes a semiconductor device having an electrode and a substrate having a wiring terminal that is conductively connected to the electrode, wherein the width of one of the electrode and the wiring terminal is formed smaller than the width of the other, and the one of the electrode and the wiring terminal is embedded in a surface of the other.

Usually, when the width and interval of an electrode and a wiring terminal becomes smaller as a result of an increase in the degree of integration in a semiconductor device, it becomes easy for conductive defects and short circuit defects to occur. However, in the present invention, the width of one of the electrode and the wiring terminal is formed smaller than the width of the other, and the one is embedded in the other. Thus, it becomes possible to reliably obtain a conductive connection state and conductive defects are reduced because the contact surface area of conductively joined portions is increased. Additionally, by making the width of the one smaller, it becomes possible to also reduce short-circuit defects.

Here, the cross-sectional shape of the one (e.g., the wiring terminal) is preferably a (e.g., tapered/arcuate) shape where the width becomes smaller towards the other (e.g., the electrode). Thus, because it becomes easy for the one of the wiring terminal and the electrode to be embedded in the other, the reliability of the conductively connected structure can be further improved. Examples of the cross-sectional shape include, but are not limited to, a trapezoidal shape, a triangular shape, a semicircular shape, a semi-oval shape and a semi-elliptic shape.

The one of the wiring terminal and the electrode (e.g., the wiring terminal) is preferably constituted by a material having a higher hardness than that of the other (e.g., the electrode). Thus, it becomes easier for the one to be embedded in the other.

Moreover, it is preferable for the embedding amount of the one with respect to the other to be within the range of about 1 µm to about 5 µm. When the embedding amount is less than 1 µm, it may become difficult to secure the conductive contact state and the reliability of the conductively joined portions may drop. In particular, when a plurality of electrodes and wiring terminals exist, it may become easy for contact defects arise due to irregularities in the heights of the electrodes and the wiring terminals. When the embedding amount exceeds 5 µm, the applied pressure for securing the embedding amount may become excessive, the potential for the semiconductor device and the like to sustain damage may increase.

Moreover, it is preferable for the electrode and the wiring terminal to both be disposed as a plurality or array, and for the widths of all of the members of the one of the wiring terminal and the electrode (e.g., the wiring terminal) conductively connected to the other (e.g., the electrode) to be formed so that they are substantially the same. Thus, because irregularities in embedding resistance in each conductively joined portion can be reduced, a substantially uniform pressure is applied to joint portions of all the electrodes and the wiring terminals, whereby irregularities in the conductive state or embedded state in the conductively joined portions can be reduced, and it becomes possible to increase the reliability of the conductively joined portions.

Another semiconductor device mounting structure of the present invention includes a semiconductor device having an electrode and a substrate having a wiring terminal that is conductively connected to the electrode, wherein the width of the wiring terminal is formed smaller than the width of the electrode, and the wiring terminal is embedded in a surface of the electrode.

Usually, in comparison to a semiconductor device that is manufactured using a microfabrication technique in a common manner, wiring and wiring terminals on a substrate are formed by a photolithographic technique or a plating process of a relatively large dimension. Thus, in order to prevent short-circuit defects and the like, it is necessary to ensure that wiring intervals are larger in comparison to electrode intervals of a semiconductor device. Therefore, by forming the width of the wiring terminal smaller than the width of the electrode, it becomes possible to reduce conductive defects and short-circuit defects overall in comparison to a case where it is configured in the opposite manner.

Here, the wiring terminal is preferably configured so as to extend from in front of the electrode to as far as a position crossing the electrode. Thus, because it becomes possible to dispose the leading end portion of the wiring terminal at an outer side of the conductively joined portion with respect to the electrode, influences affecting the conductive connection state resulting from narrowing of the width or irregularities in the dimension and sagging of the leading end portion of the wiring terminal can be reduced. Also, the margin with respect to positional displacement between the electrode and the wiring terminal seen from the direction in which the wiring terminal extends can be increased.

Also, it is preferable for microscopic conductive particles to be intervened in the portion at which the electrode and the wiring terminal are embedded. By intervening microscopic conductive particles between the electrode and the wiring terminal, the joint strength (peel strength) between the electrode and the wiring terminal can be raised by an embedding or an anchor effect of the conductive particles, and the conductive contact area can be substantially increased, whereby the reliability of the conductive connection structure can be further improved. As the microscopic conductive particles, metal particles, such as Ni particles, or particles where a conductive layer (plate layer, etc.) is formed on the surfaces of synthetic resin particles, can be used. The size of the conductive particles is preferably about 0.1 to 5 µm. Here, the conductive particles preferably have a hardness that is higher than that of at least one of the electrode and the wiring terminal. Thus, the conductive particles can be embedded in one of the electrode and the wiring terminal and it becomes possible for an anchor effect to be exhibited. In particular, an embedded state with respect to the other can be formed due to the hardness being higher than that of the other of the wiring terminal and the electrode (e.g., the electrode). Here, the conductive particles may have a hardness that is higher than that of the one of the wiring terminal and the electrode (e.g., the wiring terminal).

Moreover, it is preferable for the semiconductor device and the substrate to be adhered together with an adhesive. By adhering the semiconductor device and the substrate together with an adhesive, the embedded state between the wiring terminal and the electrode can be maintained by the adhesive force of the adhesive, whereby the reliability of the conductively joined portion can be further raised. Examples of the structure for adhering the semiconductor device and the substrate together using an adhesive in this manner include a structure using, in combination with the conductive particles, an anisotropic conductive film (ACF) and an anisotropic conductive paste where the conductive particles are dispersed in an insulating base material (the adhesive). Other examples include an insulating resin joined structure such as an NCF (Non-Conductive Film) joined structure or an NCP (Non-Conductive Paste) joined structure where, in a state where the electrode and the wiring terminal are directly joined together, a vicinity thereof is hardened with the adhesive (insulating resin).

Next, an electro-optical device of the present invention includes an electro-optical panel retaining an electro-optical substance, a wiring substrate including a wiring terminal conductively connected to the electro-optical panel and a semiconductor device including an electrode conductively connected to the wiring terminal, wherein the width of one of the wiring terminal and the electrode is formed smaller than the width of the other, and the one of the wiring terminal and the electrode is conductively connected to the other in a state where the one is embedded in a surface of the other.

Here, the cross-sectional shape of the one is preferably a shape (e.g., tapered or arcuate) where the width becomes smaller towards the other. Thus, because it becomes easy for the one to be embedded in the other, the reliability of the conductively connected structure can be further improved. Examples of the cross-sectional shape include, but are not limited to, a trapezoidal shape, a triangular shape, a semi-circular shape, a semi-oval shape and a semi-elliptic shape.

The one of the wiring terminal and the electrode is preferably configured by a material having a higher hardness than that of the other. Thus, it becomes easier for the one to be embedded in the other.

Moreover, it is preferable for the embedding amount of the one of the wiring terminal and the electrode with respect to the other to be within the range of about 1 µm to about 5 µm. When the embedding amount is less than 1 µm, it may become difficult to secure the conductive contact state and the reliability of the conductively connected structure drops. In particular, when a plurality of electrodes and wiring terminals are disposed, it may become easy for contact defects to arise due to irregularities in the heights of the electrodes and the wiring terminals. When the embedding amount exceeds 5 µm, the applied pressure for securing the embedding amount may become excessive and the potential for the semiconductor device and the like to sustain damage may increase.

Moreover, it is preferable for the electrode and the wiring terminal to both be disposed as a plurality or an array, and for the widths of all of the one of the wiring terminal and the electrode conductively connected to the other to be formed so that they are substantially the same. Thus, by forming all of the widths of the one (e.g., the wiring terminal) conductively connected to the other (e.g., the electrode) so that they are substantially the same, irregularities in embedding resistance in each conductively joined portion can be reduced. Thus, partial contact at the time pressure is applied is alleviated and a substantially uniform pressure is applied to joint portions of all the electrodes and the wiring terminals, whereby irregularities in the conductive state or embedded state in the conductively joined portions can be reduced, and it becomes possible to increase the reliability of the conductively joined portions.

Another electro-optical device of the present invention includes a semiconductor mounting structure including a semiconductor device having an electrode and a substrate having a wiring terminal that is conductively connected to the electrode, wherein the width of the wiring terminal is formed smaller than the width of the electrode, and the wiring terminal is embedded in a surface of the electrode.

Usually, in comparison to a semiconductor device that is manufactured using a microfabrication technique in a common manner, wiring and wiring terminals on a substrate are formed by a photolithographic technique or a plating process of a relatively large dimension. Thus, in order to prevent short-circuit defects and the like, it is necessary to ensure that wiring intervals are larger in comparison to electrode intervals of a semiconductor device. Therefore, by forming the width of the wiring terminal smaller than the width of the electrode, it becomes possible to reduce conductive defects and short-circuit defects overall in comparison to a case where it is configured in the opposite manner.

Here, the wiring terminal is preferably configured so as to extend from in front of the electrode to as far as a position crossing the electrode. Thus, because it becomes possible to dispose the leading end portion of the wiring terminal at an outer side of the conductively joined portion with respect to the electrode, influences with respect to the conductively connected structure resulting from narrowing of the width or irregularities in the dimension and sagging of the leading end portion of the wiring terminal can be reduced. Also, the margin with respect to positional displacement between the electrode and the wiring terminal seen from the direction in which the wiring terminal extends can be increased.

Also, it is preferable for microscopic conductive particles to be intervened in the portion at which the electrode and the wiring terminal are embedded. By intervening microscopic conductive particles between the electrode and the wiring terminal, the joint strength (peel strength) between the electrode and the wiring terminal can be raised by an embedding or an anchor effect of the conductive particles, and the conductive contact area can be substantially increased, whereby the reliability of the conductively joined portion can be further improved. As the microscopic conductive particles, metal particles, such as Ni particles, or particles where a conductive layer (plate layer, etc.) is formed on the surfaces of synthetic resin particles, can be used. The size of the conductive particles is preferably about 0.1 to 5 µm. Here, the conductive particles preferably have a hardness that is higher than that of at least one of the electrode and the wiring terminal. Thus, the conductive particles can be embedded in one of the electrode and the wiring terminal and it becomes possible for an anchor effect to be exhibited. In particular, an embedded state with respect to the other of the wiring terminal and the electrode can be formed due to the hardness being higher than that of the other (e.g., the electrode). Here, the conductive particles may have a hardness that is higher than that of the one of the wiring terminal and the electrode (e.g., the wiring terminal).

Moreover, it is preferable for the semiconductor device and the substrate to be adhered together with an adhesive. By adhering the semiconductor device and the substrate together with an adhesive, the embedded state between the wiring terminal and the electrode can be maintained by the adhesive force of the adhesive, whereby the reliability of the conductively joined portion can be further raised. Examples of the structure for adhering the semiconductor device and the substrate together using an adhesive in this manner include a structure using, in combination with the conductive particles, an anisotropic conductive film (ACF) and an anisotropic conductive paste where the conductive particles are dispersed in an insulating base material (the adhesive). Other examples include an insulating resin joined structure such as an NCF (Non-Conductive Film) joined structure or an NCP (Non-Conductive Paste) joined structure where, in a state where the electrode and the wiring terminal are directly joined together, a vicinity thereof is hardened with the adhesive (insulating resin).

Next, an electronic device of the present invention includes the semiconductor device mounting structure of any of the above. The semiconductor device mounting structure can usually be applied to various electronic devices including a conductively joined portion formed by a semiconductor device being directly mounted on a substrate. Thus, high integration of the electronic device can be accommodated and the reliability of the electronic device can be improved.

Another electronic device of the present invention includes the electro-optical device of any of the above and control means that controls the electro-optical device. The electro-optical device can be applied to various electronic devices together with the control means that controls the electro-optical device. Thus, high integration of the electronic device provided with the electro-optical device can be accommodated and the reliability of the electronic device can be improved.

It is preferable for each of the above-described electronic devices to be a portable electronic device such as a mobile telephone, a portable information terminal, a pager, or an electronic wrist watch. In the case of portable electronic devices, because there is a demand for the devices to be compact and lightweight, there is a demand for high integration of semiconductor devices and miniaturization of electro-optical devices. Thus, applying the present invention to such cases is extremely effective.

Next, a method of manufacturing an electro-optical device of the present invention is a method of manufacturing an electro-optical device that includes an electro-optical panel retaining an electro-optical substance, a wiring substrate including a wiring terminal conductively connected to the electro-optical panel and a semiconductor device including an electrode conductively connected to the wiring terminal, wherein the width of one of the wiring terminal and the electrode is formed smaller than the width of the other, and the one is conductively connected to the other by embedding the one in a surface of the other.

Another method of manufacturing an electro-optical device of the present invention is a method of manufacturing an electro-optical device that includes an electro-optical panel retaining an electro-optical substance, a wiring substrate including a wiring terminal conductively connected to the electro-optical panel and a semiconductor device including an electrode conductively connected to the wiring terminal, wherein the width of the wiring terminal is formed smaller than the width of the electrode, and the wiring terminal is embedded in a surface of the electrode.

BRIEF DESCRIPTION OF THE DRAWINGS

FIG. 7 is an enlarged partial perspective views illustrating the shape of a leading end portion vicinity of a wiring terminal prior to the mounting step in the same embodiment.

DETAILED DESCRIPTION

Next, embodiments of a semiconductor device mounting method, a semiconductor device mounting structure, an electro-optical device and an electronic device pertaining to the present invention will be described in detail with reference to the attached drawings.

Figure 1:
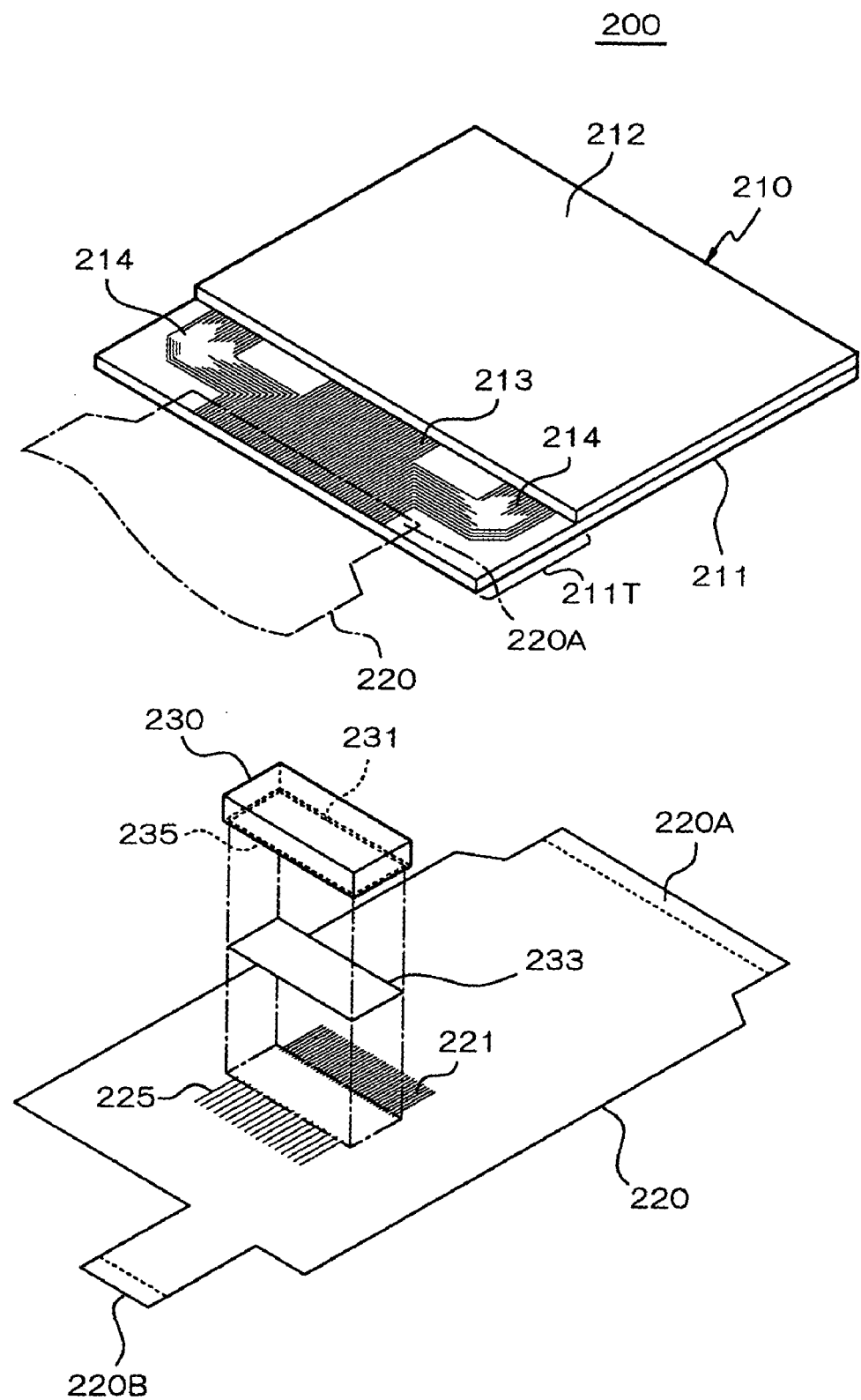
FIG. 1 is an exploded perspective view of a liquid crystal device for illustrating an embodiment of a semiconductor device mounting method, a semiconductor device mounting structure, an electro-optical device and an electronic device pertaining to the present invention.

FIG. 1 is an exploded perspective view illustrating the overall configuration of a liquid crystal device 200, which is the electro-optical device of the present embodiment. The liquid crystal device 200 includes a liquid crystal panel 210, a wiring substrate 220 that is connected to the liquid crystal panel 210, and a semiconductor device (semiconductor bare chip) 230 that is mounted on the wiring substrate 220.

In the liquid crystal panel 210, substrates 211 and 212 constituted by transparent glass or plastic are adhered together via an unillustrated sealing material, and unillustrated liquid crystal is charged therebetween. In the liquid crystal panel 210, there are cases where unillustrated polarizing plates or phase-difference plates are respectively adhered to outer surfaces of the substrates 211 and 212 in accordance with the liquid crystal mode, and there are also cases where an unillustrated reflective plate or backlight is disposed at the side opposite to the viewing side.

A substrate extension portion 211T of the substrate 211 extends further out to the surrounding area than the outer shape of the substrate 212. Wirings 213 and 214, which extend out from a liquid crystal charging region or a display region where the two substrates 211 and 212 face each other, are formed on an inner surface of the substrate extension portion 211T, and leading end portions thereof are arranged, as input terminals, on a substrate end portion of the substrate extension portion 211T.

The wiring substrate 220 includes a base material constituted by an insulating resin, such as a polyester resin or a polyimide resin, and a wiring pattern constituted by a conductor such as copper or the like. The wiring substrate 220 is preferably configured as a flexible printed circuit (having flexibility and elasticity) in which the base material is formed at a thickness of about 50 μm to 1 mm. In this case, the wiring substrate 220 includes a structure described later so that a more reliable and uniform conductively connected state of conductively joined portions can be realized because it becomes easier to concentrate pressure applied at the time of mounting at the conductively joined portions formed by a method described later. Included in this wiring pattern are a panel-side wiring terminal 221, which is conductively connected to a panel-side connection portion 220A electrically connected to the input terminals of the liquid crystal panel 210, and a device-side wiring terminal 225, which is conductively connected to a device-side connection portion 220B connected to another circuit substrate and the like within the electronic device. In the present embodiment, a metal such as copper or aluminum, or a material where a surface-conductive layer constituted by copper, nickel or aluminum is adhered and formed at portions of surfaces of various metals that are to be connected to at least electrodes 231 and 235, is used for the wiring terminals 221 and 225. When the wiring pitch is 50 μm or less and particularly about 20 to 40 μm, it is preferable for the widths of the wiring terminals to be about 10 to 20 μm and typically about 15 μm. It is preferable for the heights of the wiring terminals to be about 8 to 12 μm.

The semiconductor device 230 includes the electrodes 231 and 235 such as plurally formed bump electrodes. A metal such as gold, aluminum, solder or an Ag—Sn alloy, or a material where a surface-conductive layer constituted by gold, aluminum, solder or an Ag—Sn alloy is adhered and formed on a surface of a metal, is used for the electrodes 231 and 235. It is preferable for at least surface portions of the electrodes 231 and 235 to be formed with a material that is softer than at least top portion vicinities of the wiring terminals 221 and 225. For example, if the top portion vicinities of the wiring terminals are formed with copper, the surface portions of the electrodes are formed with gold or aluminum. When the electrode pitch is 50 μm or less (e.g., about 20 to 40 μm), it is preferable for the widths of the electrodes 231 and 235 to be about 20 to 30 μm and typically about 25 μm. It is preferably for the heights of the electrodes 231 and 235 to be about 15 to 20 μm. The semiconductor device 230 is mounted on the wiring substrate 220 via an anisotropic conductive film 233 so that the electrode 235 is conductively connected to the wiring terminal 225.

Figure 2:
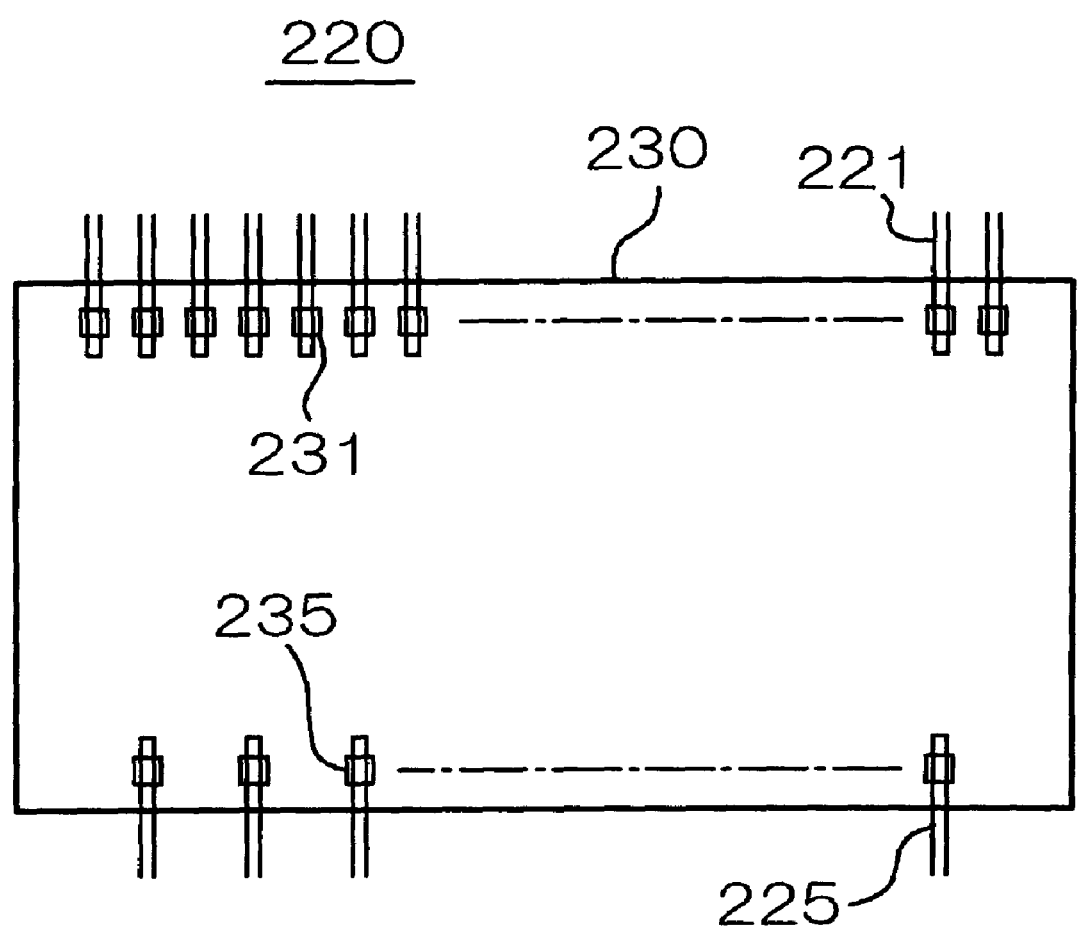
FIG. 2 is a plan view of mounting portions of a semiconductor device in the same embodiment.

FIG. 2 is a perspective view illustrating the semiconductor device 230 mounted on the substrate as seen from a back surface side of the wiring substrate 220 with respect to the liquid crystal device 200. As shown in FIG. 2, the wiring terminals 221 and 225 both extend in the illustrated up and down directions, and leading ends thereof pass across the electrodes 231 and 235 and are disposed beyond these. The widths (widths seen in the illustrated left and right directions) of the wiring terminals 221 and 225 of the wiring substrates 220 are formed smaller than the width (width seen in the illustrated left and right directions) of the semiconductor device 230.

Here, at least the widths of all of the wiring terminals 221 and 225 conductively connected to the electrodes 231 and 235 of the semiconductor device 230 are formed so as to have substantially the same value. Thus, because a reaction force received from each wiring terminal becomes substantially uniform when plural electrodes 231 and 235 disposed at the semiconductor device 230 are pressure-contacted to the wiring terminals 221 and 225, a so-called partial contact state does not arise or, even if the state does arise, the extent thereof is alleviated more than in a case where there are irregularities in the widths of the wiring terminals. Thus, a substantially uniform pressure is applied to each conductively joined portion and the portions are formed in the same joined state, and conductive connection defects are reduced overall.

Figure 3:
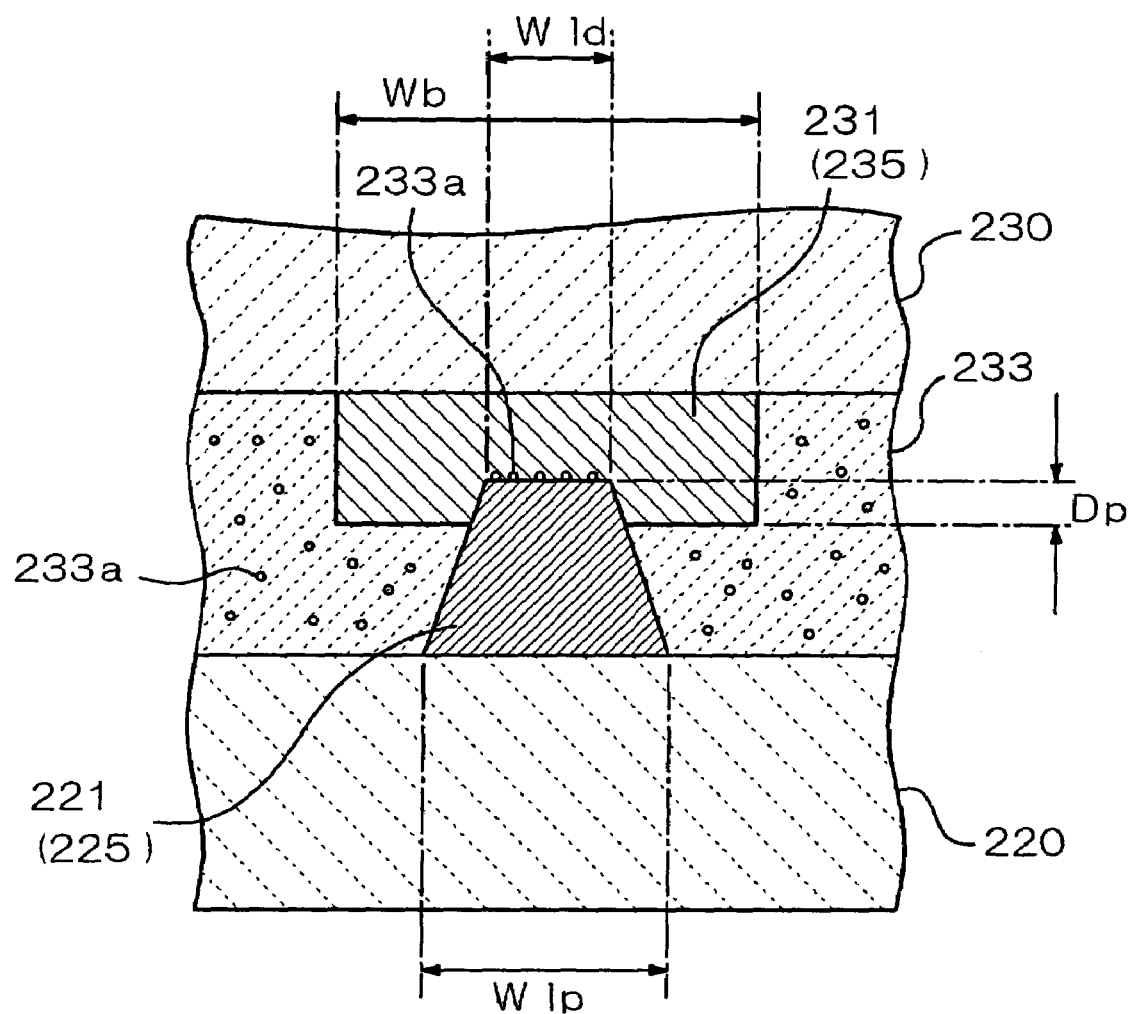
FIG. 3 is an enlarged partial cross-sectional view of the mounted portions of the semiconductor device in the same embodiment.

FIG. 3 is an enlarged partial cross-sectional view showing the conductively connected structure of the wiring substrate 220 and the semiconductor device 230. As shown in FIG. 3, in the present embodiment, the wiring terminals 221 and 225 are disposed with a cross-sectional shape where the width thereof becomes smaller towards the electrodes 231 and 235. For instance, in the example illustrated, the cross-sectional shape of the wiring terminals 221 and 225 is trapezoidal. The cross-sectional shape may be of any shape as long as the width thereof becomes smaller towards the electrodes (i.e., in the illustrated up direction), and can be formed in various shapes such as a triangular shape, a semicircular shape, a semi-oval shape, a semi-elliptic shape, or stepped shapes where the width becomes smaller upwards. In this manner, when the wiring terminals 221 and 225 have a cross-sectional shape where the width becomes smaller towards the electrodes, a width "W1$d$" of the top portion of each wiring terminal becomes smaller than a width "W1$p$" of a base portion (portion on the surface of the wiring substrate 220) of each wiring terminal. In this case, it is good if the width "W1$d$" of the top portion of each wiring terminal is formed smaller than a width "Wb" of the electrodes 231 and 235.

The width "W1$d$" (the case including the cross-sectional shape where the width of the wiring terminals becomes smaller towards the electrodes) or the width "W1$p$" (the case where the width of the wiring terminals is constant) of the wiring terminals is preferably within the range of about 10 to 60% of the width "Wb" of the electrodes 231 and 235. When the width is less than this range, the conductive contact area in the conductively joined portions of the wiring terminals and the electrodes may drop, and the stability and reliability of the conductively contacted state may drop. When the width exceeds this range, embedding of the wiring terminal described later may become difficult, it may become easy for the entire shape of the electrode to collapse at the time pressure is applied, and structural stability and reproducibility of the conductively joined portion may drop.

In the present embodiment, the top portions of the wiring terminals 221 and 225 are joined to, so as to be embedded in, the electrodes 231 and 235. An embedding amount "Dp" thereof is set to become about 1 μm to about 5 μm. When the embedding amount "Dp" is less than 1 μm, partial contact may easily occur, which results from irregularities in the heights of the wiring terminals 221 and 225 and the electrodes 231 and 235, the applied pressure may become non-uniform, and the reliability of the conductively contacted state between the wiring terminals 221 and 225 and the electrodes 231 and 235 may drop. When the embedding amount "Dp" exceeds 5 μm, the applied pressure required at the time of mounting may become excessive and unignorable damage to the semiconductor device 230 may easily occur.

In the present embodiment, as shown in FIG. 1, mounting is conducted by a method where pressure is applied, with respect to the substrate 220, to the semiconductor device 230 via the anisotropic conductive film 233 on the surface of the wiring substrate 220 and heat is applied between the wiring substrate 220 and the semiconductor device 230. In actuality, the semiconductor device 230 is heated with a pressurizing and heating head, and the anisotropic conductive film 233 is heated by heat transmitted thereto. The anisotropic conductive film 233 is a film where the microscopic conductive particles 233$a$ are dispersed in the insulating base material constituted by a thermoplastic resin or a thermosetting resin. As the conductive particles 233$a$, particles configured by a metal such as Ni or the like, or particles where a conductive layer of Ni plating or the like is formed on the surfaces of particles constituted by a synthetic resin, are used. There are no particular limitations on the particle diameter of the conductive particles 233a as long as it does not hinder the stability and reliability of the joined portions between the wiring terminals and the electrodes resulting from embedding. However, the particle diameter is preferably within the range of about 0.1 μm to 5.0 μm. When the particle diameter of the conductive particles 233a is less than this range, the effect resulting from the embedding of the conductive particles or an anchor effect may drop. When the particle diameter exceeds this range, the contact area of the conductively joined portions between the wiring terminals and the electrodes is reduced, and the stability and reliability of the conductively joined portions may drop.

In the present embodiment, the semiconductor device 230 is gripped by, for example, the unillustrated pressurizing and heating head and pressurized and adhered to the surface of the wiring substrate 220 via the anisotropic conductive film 233. Then, while heating, the semiconductor device 230 is pressurized, with respect to the wiring substrate 220, by a predetermined pressure. Thus, the base material of the anisotropic conductive film 233 is temporarily softened, and the wiring terminals 221 and 225 and the electrodes 231 and 235 are brought into conductive contact via the conductive particles 233a. Although this seems the same as in conventional mounting methods, in the case of the present embodiment, the widths of the wiring terminals 221 and 225 are formed smaller than the widths of the electrodes 231 and 235, and the wiring terminals 221 and 225 are pressurized, with respect to the electrodes 231 and 235, by a pressure that is higher (ordinarily, 1.2 to 1.5 times higher) than has conventionally been the case. Thus, as described above, the top portions of the wiring terminals 221 and 225 become embedded in the surfaces of the electrodes 231 and 235 and the embedding amount "Dp" is set.

At this time, due to the fact that the conductive particles 233a are present, the conductive particles 233a become embedded in the surface of the electrodes 231 and 235. Because the conductive particles 233a are constituted by a material having a higher hardness than the surface portions of the electrodes 231 and 235, they are easily embedded in the surfaces of the electrodes 231 and 235, and the joint strength (or peel strength) of the semiconductor device 230 is strengthened due to the anchor effect thereof. It should be noted that, although the conductive particles 233a have the same hardness as the top portions of the wiring terminals 221 and 225 in the present embodiment, the conductive particles 233a may also be constituted by a material having a higher hardness than the top portions of the wiring terminals 221 and 225. In this case, the conductive particles 233a also become embedded in the wiring terminals 221 and 225.

The base material of the anisotropic conductive film 233 is, as described above, hardened by heating at the time of mounting (in the case of the thermosetting resin) or by cooling after the heating (in the case of the thermoplastic resin), to thereby adhere the wiring substrate 220 and the semiconductor device 230 together. This base material functions as an adhesive and fulfils the role of retaining the conductively joined state between the wiring terminals 221 and 225 and the electrodes 231 and 235. In the present embodiment, as is illustrated, the base material of the anisotropic conductive film 233 is temporarily softened at the time of mounting, which results in a structure where the space between the wiring substrate 220 and the semiconductor device 230 is completely filled.

Figure 4:
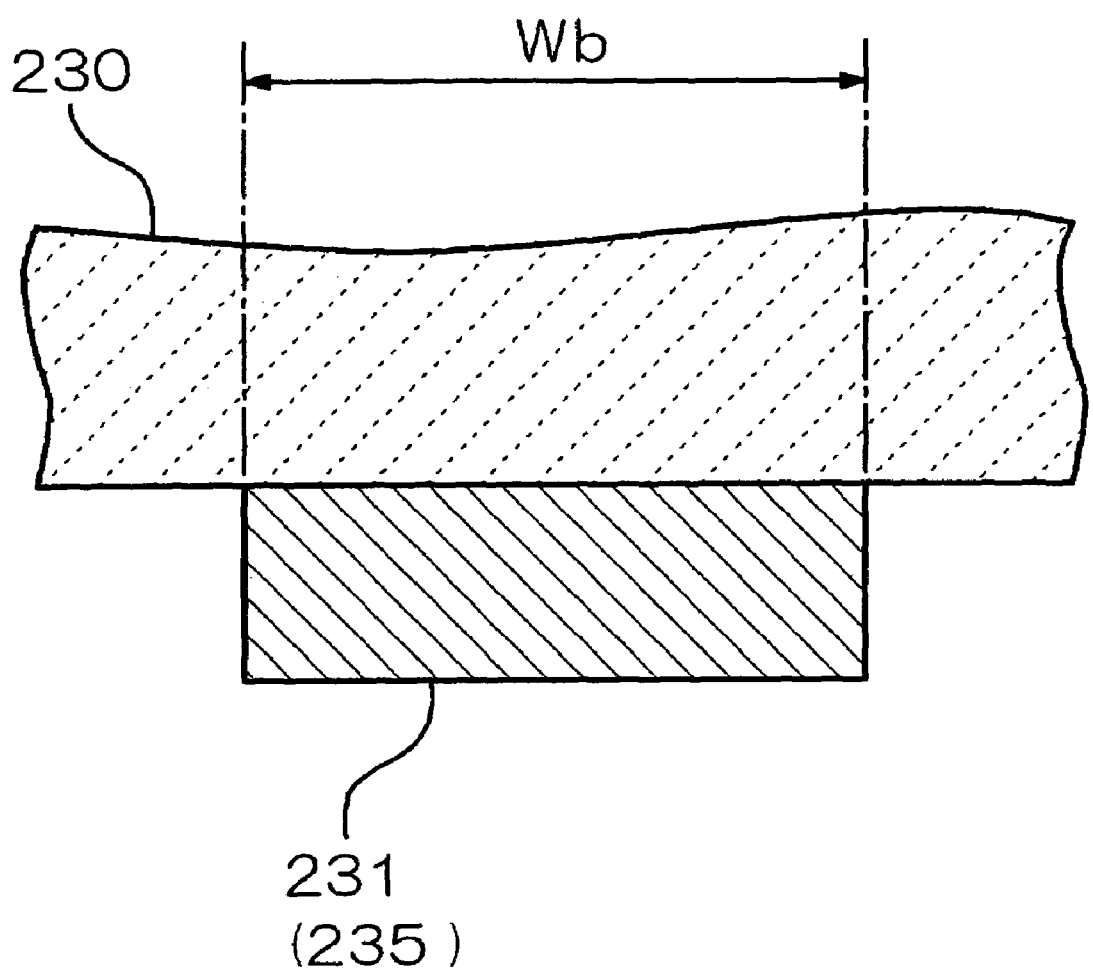
FIG. 4 is an enlarged partial cross-sectional view illustrating an electrode structure of the semiconductor device prior to a mounting step in the same embodiment.

FIG. 4 is an enlarged cross-sectional view illustrating the structure of the electrodes 231 and 235 of the semiconductor device 230 prior to the mounting step. In the semiconductor device 230 of the present embodiment, the electrodes 231 and 235 are disposed with a substantially flat surface. By disposing electrodes with flat surfaces in this manner, it becomes easy for the wiring terminals 221 and 225 to be embedded in the surfaces of the electrodes 231 and 235 and, even if irregularities in the shapes and heights of the wiring terminals 221 and 225 and the electrodes 231 and 235 are present, irregularities in the conductively contacted state (size of the contact area and degree of the embedding amount) can be reduced. Here, although the electrodes 231 and 235 may be constituted by a uniform material as in the illustrated example, a surface-conductive layer constituted by a different material may be formed on the surface so that the surface-conductive layer is constituted by a relatively soft material (e.g., metal) into which the wiring terminals are easily embedded, whereby the electrodes have excellent characteristics with respect to the wiring terminals 221 and 225 (not illustrated in FIG. 4) and collapse of the overall shapes of the electrodes resulting from the pressure applied at the time of mounting can be prevented. Also, even if the material of the surface-conductive layer is an expensive material such as gold, the use amount thereof can be reduced, whereby manufacturing costs can be reduced.

Figure 5:
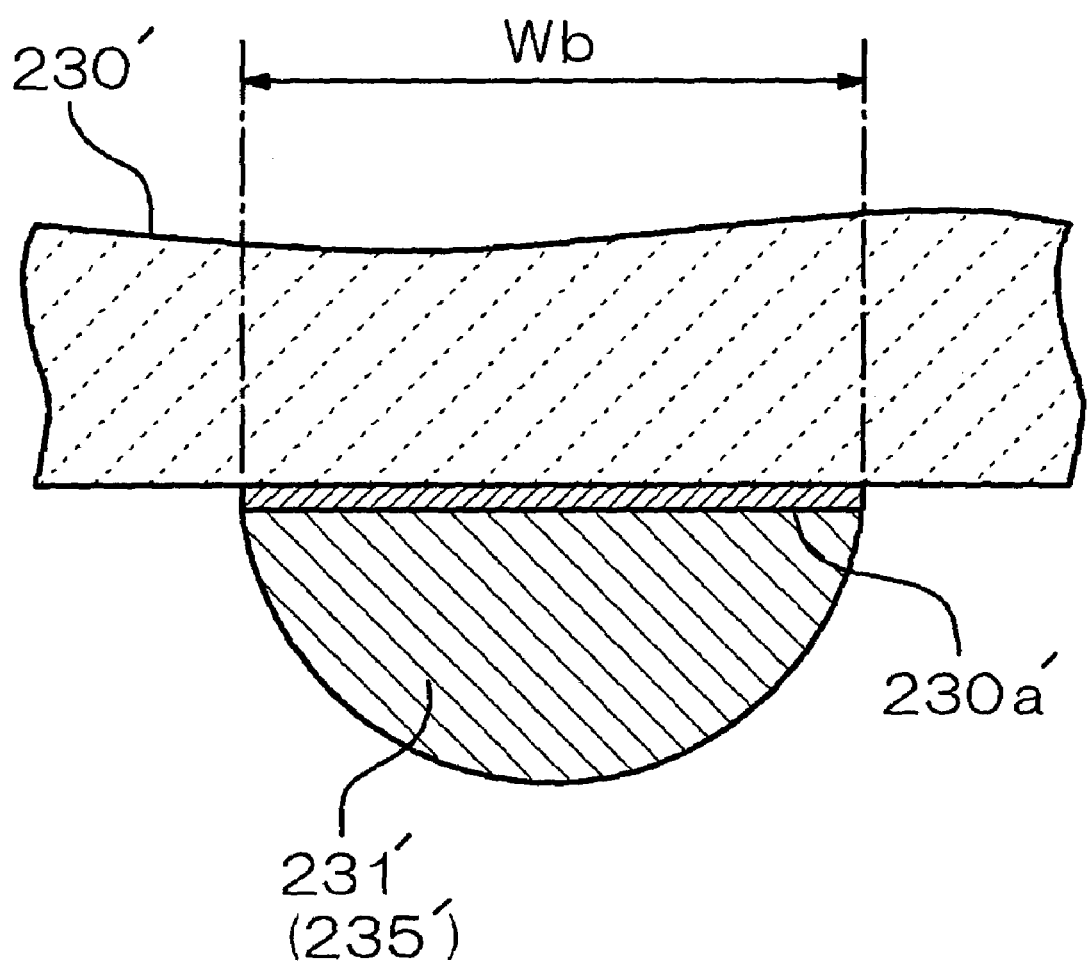
FIG. 5 is an enlarged partial cross-sectional view illustrating an electrode structure of another semiconductor device prior to the mounting step in the same embodiment.

FIG. 5 illustrates an electrode structure, which is different from that of the above-described embodiment, of a semiconductor device 230' prior to the mounting step. The semiconductor device 230' has a structure where an electrode pad 230a' is formed on a surface of a semiconductor layer of the semiconductor device 230' and electrodes 231' and 235' for configuring protruding electrodes are joined to a surface of the electrode pad 230a'. By configuring the electrodes in this manner, the electrode pad 230a' can be formed with a material having excellent conductive connectivity with respect to the semiconductor layer of the semiconductor device 230', and the electrodes 231' and 235' can be formed with a material having characteristics that are suitable with respect to conductive joining with the wiring terminals 221 and 225 (not illustrated in FIG. 5). Thus, an excellent conductively connected state can be realized.

The electrodes 231' and 235' shown in FIG. 5 are disposed with a cross-sectional shape having a convexly curving surface approximating a semicircular shape. When electrodes of this shape are manufactured, there are the advantages that labor for precisely molding the electrode shapes is not required and the electrodes can be formed at a relatively low cost by a method such as printing or welding a low-melting metal.

Figure 6:
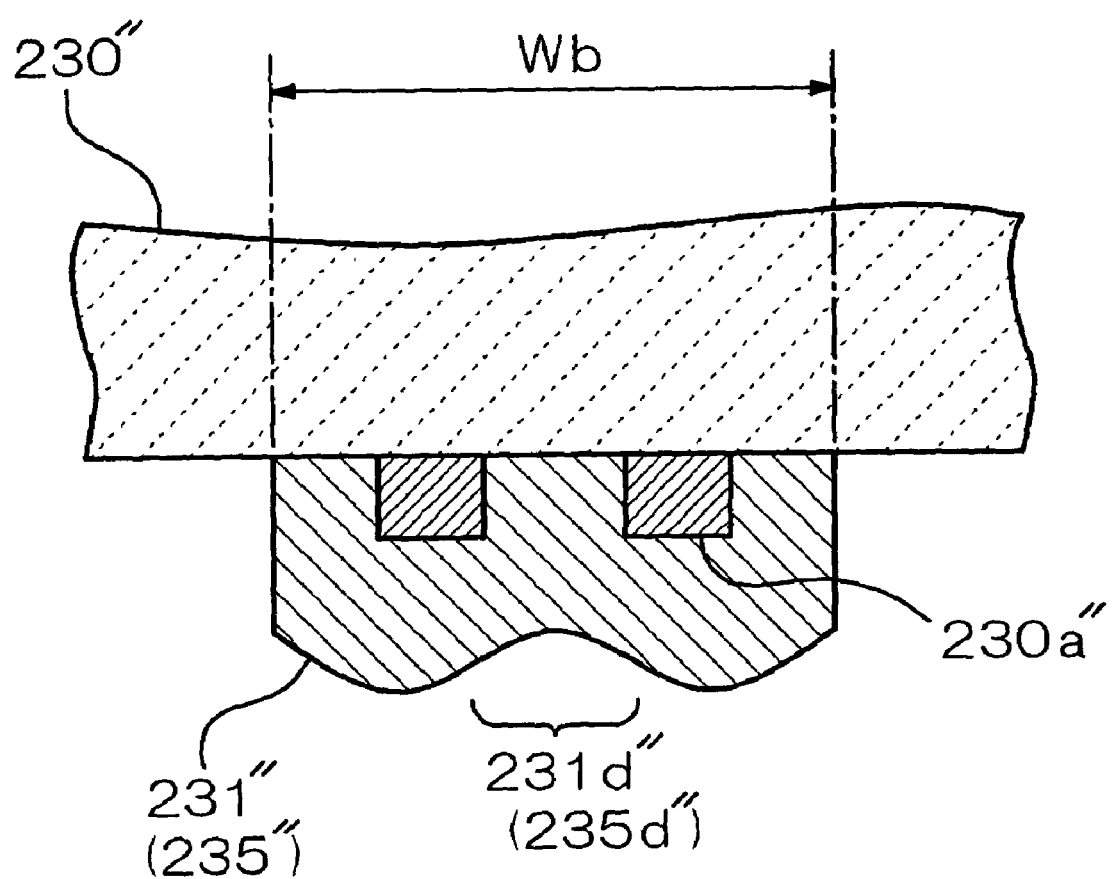
FIG. 6 is an enlarged partial cross-sectional view illustrating an electrode structure of a still another semiconductor device prior to the mounting step in the same embodiment.

FIG. 6 illustrates an electrode structure, which is different from that of the above-described embodiment, of a semiconductor device 230" prior to the mounting step. In the semiconductor device 230", an electrode pad 230a" that is conductively brought into contact with a semiconductor layer is selectively formed at two places in the width direction, and electrodes 231" and 235" are formed on these electrode pads 230a" so as to cover both of the electrode pads 230a" of the two places. The electrodes pads 230a" can be easily formed by using an ordinary patterning technique such as photolithography.

By configuring the electrodes in this manner, the electrodes 231" and 235" reflect a convexo-concave structure configured by the electrode pads 230a" of the undersurface and are disposed with surfaces having a convexo-concave shape in the width direction thereof. That is, recessed portions 231d" and 235d" are formed in a width-direction center portion in the surfaces of the electrodes 231" and 235". By making the interval between the electrode pads 230a" substantially equal to the widths of the wiring terminals, the recessed portions 213d" and 235d" are constituted by a dimension corresponding to the widths of the wiring terminals 221 and 225 (not illustrated in FIG. 6). Thus, due to the fact that the recessed portions 231d" and 235d" are present, there is the advantage that the applied pressure for obtaining the embedded state (the aforementioned embedding amount "Dp") of the wiring terminals 221 and 225 shown in FIG. 3 can be effectively reduced. The fact that the applied pressure can be reduced in this manner means that damage to the semiconductor device 230" can be further reduced and product yield can be increased.

FIG. 7(a) is a perspective view illustrating the shape of the leading end portion vicinity of the wiring terminals 221 and 225 of the present embodiment, and FIG. 7(b) is a perspective view illustrating a modified example thereof. Although the wiring terminals 221 and 225 are configured in a cross-sectionally trapezoidal shape (a triangular, semicircular or stepped shape is also possible) as mentioned above, the cross-sectional shape of the leading end portion vicinity of the wiring terminals 221 and 225 collapses (tapers) and the width becomes smaller towards the leading end. The reason for this is because it becomes easy for side etching to arise in the leading end portion of a mask for patterning because the wiring pattern including the wiring terminals 221 and 225 is formed by a patterning technique using photolithography or the like. Thus, in the present embodiment, as shown in FIG. 7(a), the wiring terminals 221 and 225 are formed so as to pass across the joined portions with the electrodes 231 and 235 and extend as far as beyond these, so that the wiring terminals 221 and 225 are not joined to the electrodes 231 and 235 at the leading end portions (length "Lp"). Thus, because collapse of the cross-sectional shapes of the leading end portions of the wiring terminals 221 and 225 joined to the electrodes 231 and 235 and width reduction can be prevented, irregularities in the conductively connected state can be reduced. By configuring the invention in this manner, there is also the advantage that the margin with respect to positional displacement between the wiring terminals 221 and 225 and the electrodes 231 and 235 in the direction in which the wiring terminals 221 and 225 extend can be increased.

As described above, in order to form the wiring terminals so that they have a cross-sectional shape in which the width becomes smaller towards the electrodes, etching may be administered for a short time with respect to the wiring terminals after the wiring pattern is formed, and corner portions of the top portions may be removed. Other examples include a method where the wiring terminals are formed with a wide width at the time of initial patterning and then etching is conducted for a short time in a state in which a narrow-width mask is formed at the time of later patterning, and a method where a narrow-width conductive layer is further deposited on a wide-width wiring layer.

The wiring terminals 221' and 225' shown in FIG. 7(b) are the terminals shown in FIG. 5, and the cross-sectional shapes thereof are substantially semicircular. In the case of these wiring terminals 221' and 225' also, because collapse of the cross-sectional shapes and narrowing of the widths arise towards the leading ends in exactly the same manner as described above, pattern formation is conducted so that the wiring terminals extend across the electrodes in the same manner as described above. The wiring terminals of these cross-sectional shapes can also be formed by the same method as described above.

As described above, although the length "Lp" of the leading end portions in which collapse of the cross-sectional shapes and narrowing of the widths arise differs depending on the patterning technique, it is about 1 μm to 5 μm in ordinary photolithography using ultraviolet rays or the like. Thus, the length of the portions of the wiring terminals extending across the electrodes is preferably set to be about 5 to 10 μm on average.

In the above-described embodiment, the width of the wiring terminals was smaller than the width of the electrodes and the conductively connected structure was such that the wiring terminals were embedded in the electrodes. However, conversely, the width of the electrodes may be made smaller than the width of the wiring terminals and the conductively connected portions may have a structure where the electrodes are embedded in the wiring terminals. In this case, the surface portions of the electrodes are preferably constituted by a material that is softer than the surface portions of the wiring terminals.

Figure 8:
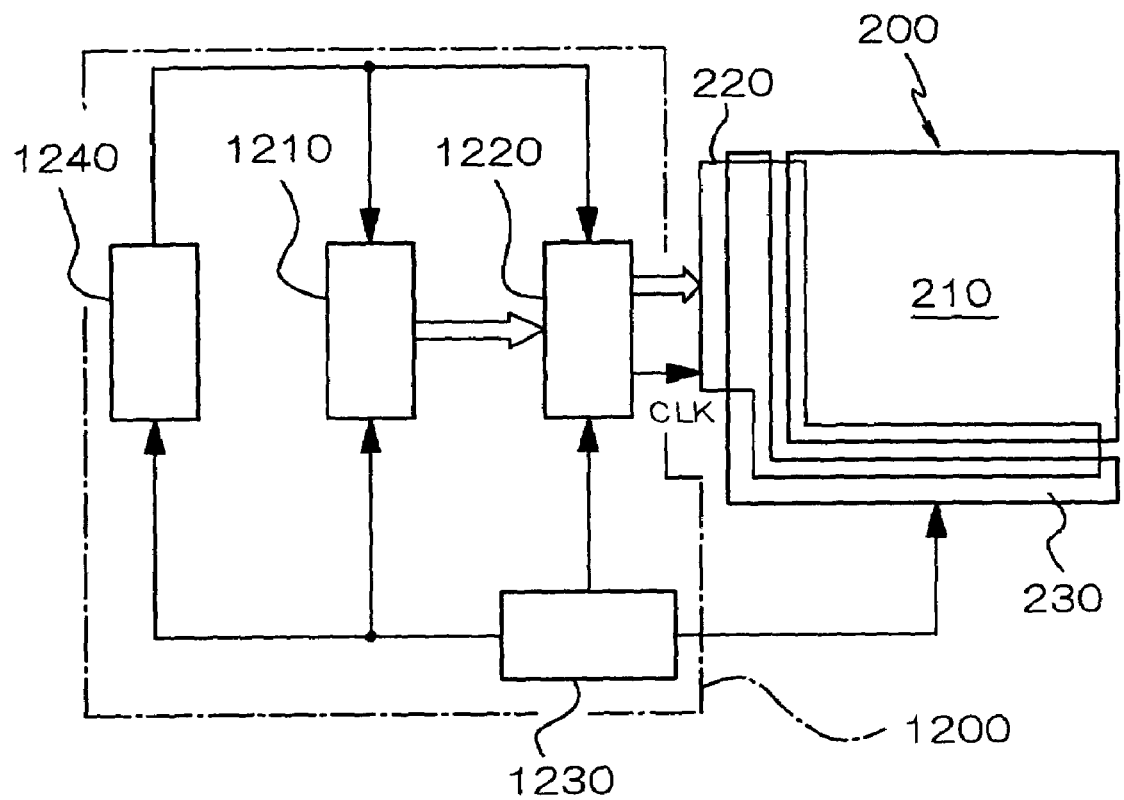
FIG. 8 is a schematic structural diagram illustrating the structure of a liquid crystal device and its control system of an embodiment of an electronic device pertaining to the present invention.

Next, description will be given of an embodiment in a case where an electro-optical device including the liquid crystal device 200 is used as a display device in an electronic device. FIG. 8 is a schematic structural diagram illustrating the overall configuration of the present embodiment. The electronic device illustrated here includes the same liquid crystal device 200 described above and control means 1200 that controls the liquid crystal device 200. Here, the liquid crystal device 200 includes, as mentioned above, the liquid crystal panel 210, the wiring substrate 220 and the semiconductor device 230.

Also, the control means 1200 includes a display information output source 1210, a display information processing circuit 1220, a power circuit 1230 and a timing generator 1240.

The display information output source 1210 is disposed with a memory comprising a ROM (Read Only Memory), a RAM (Random Access Memory) and the like; a storage unit comprising an electromagnetic recording disk, a light recording disk and the like; and a tuning circuit that tunes and outputs a digital image signal. The display information output source 1210 is configured so as to supply, to the display information processing circuit 1220, display information in the form of an image signal of a predetermined format on the basis of various kinds of clock signals generated by the timing generator 1240.

The display information processing circuit 1220 is disposed with various known circuits such as a serial-parallel conversion circuit, an amplification/inversion circuit, a rotation circuit, a gamma correction circuit and a clamp circuit. The display information processing circuit 1220 implements processing of inputted display information and supplies this image information together with a clock signal CLK to the semiconductor device 230 via the wiring substrate 220. The semiconductor device 230 includes a scanning line drive circuit, a data line drive circuit and a testing circuit. Also, the power circuit 1230 respectively supplies a predetermined voltage to the aforementioned various constituent elements.

Figure 9:
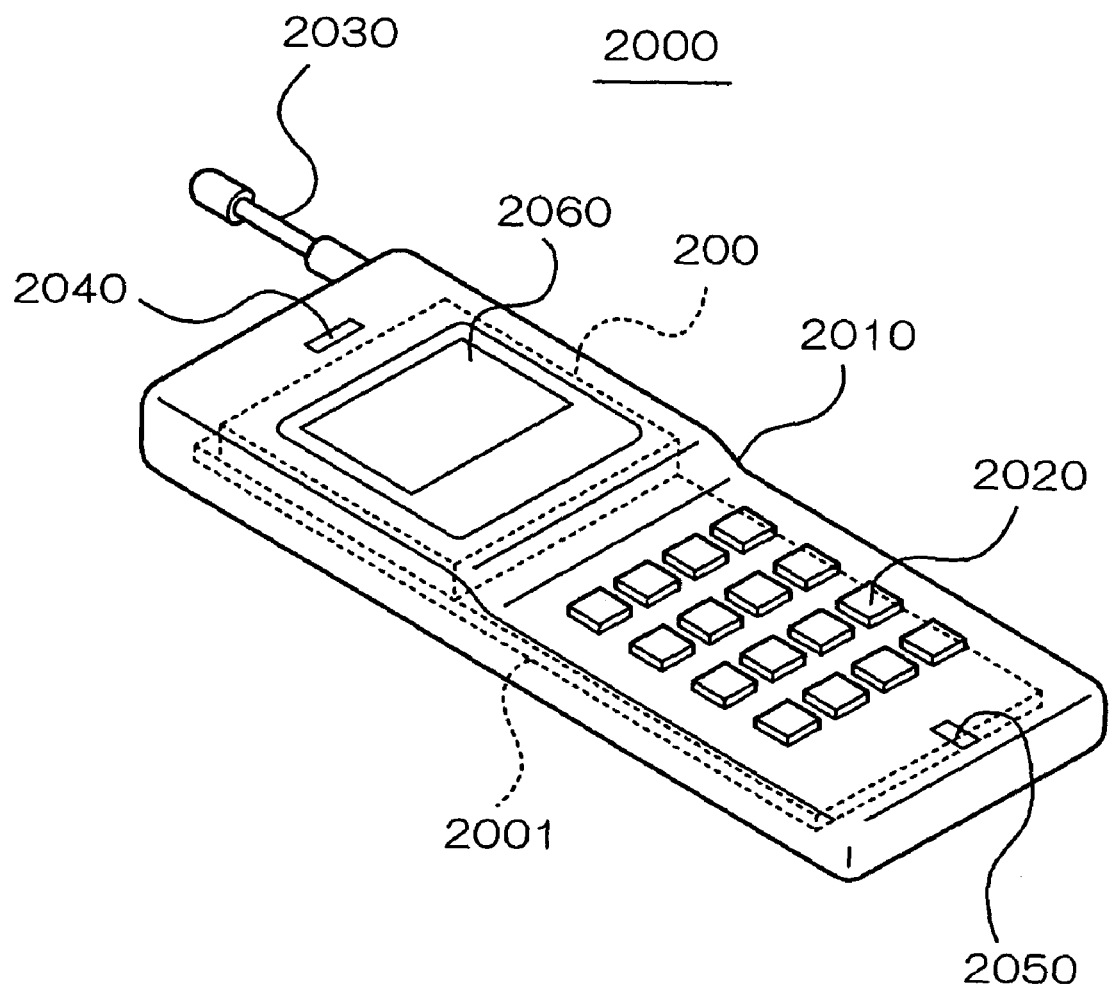
FIG. 9 is a schematic perspective view illustrating an exterior of a mobile telephone serving as one example of the electronic device pertaining to the present invention.
Figure 10:
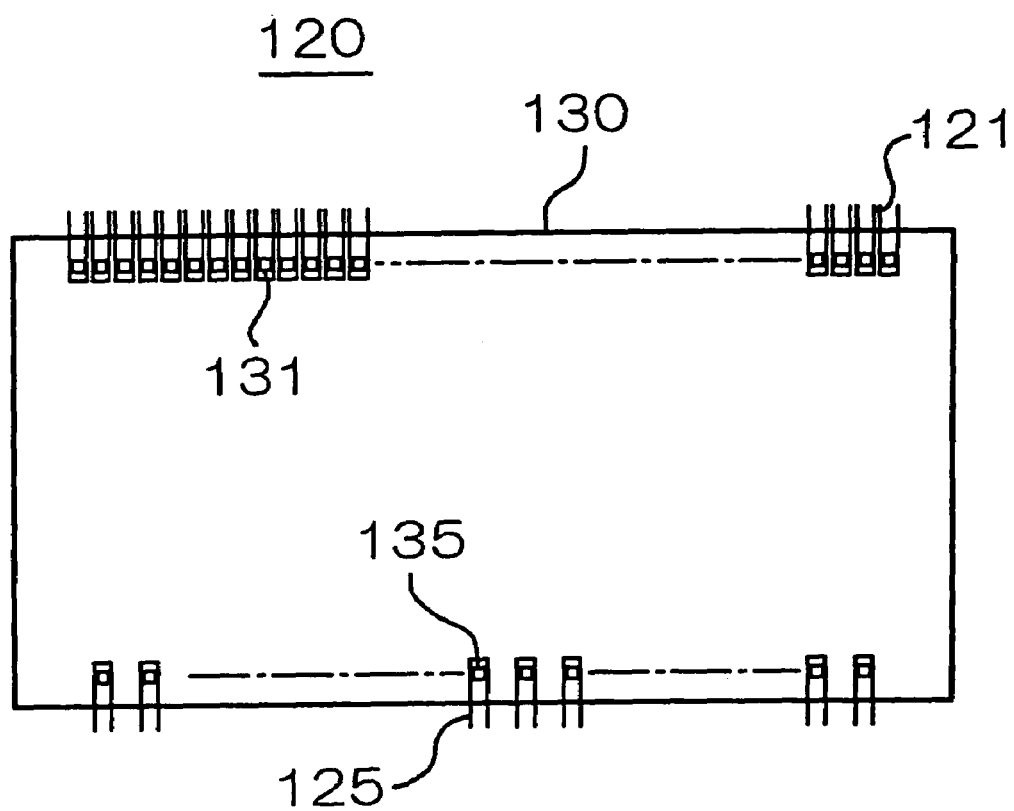
FIG. 10 is a plan view illustrating the structure of mounted portions of a conventional semiconductor device.
Figure 11:
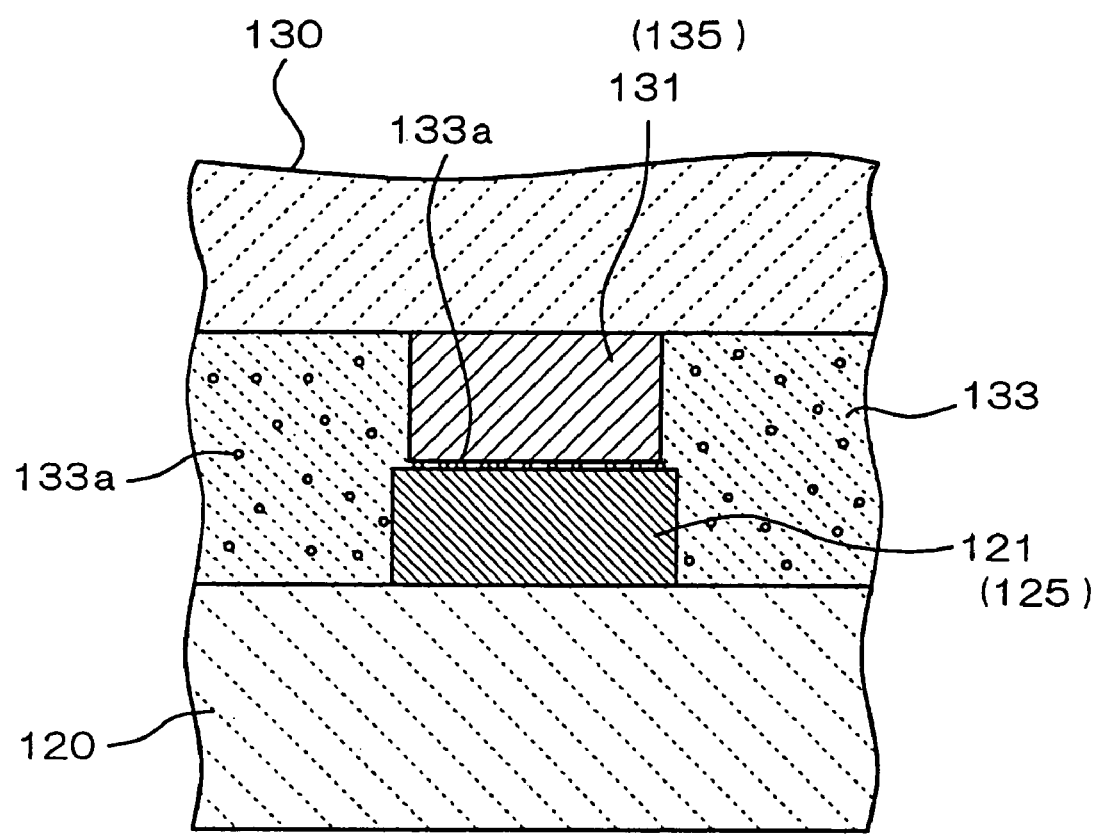
FIG. 11 is an enlarged partial cross-sectional view illustrating the structure of the mounted portions of the conventional semiconductor device.

FIG. 9 illustrates a mobile telephone 2000, which is an embodiment of the electronic device pertaining to the present invention. In the mobile telephone 2000, a circuit board 2001 is disposed inside a case body 2010 and the liquid crystal device 200 is mounted with respect to the circuit board 2001. Operational buttons 2020 are arranged on a front surface of the case body 2010, and an antenna 2030 is attached so as to be pulled out from and pushed into an end portion. A speaker is disposed inside a receiver portion 2040, and a microphone is built inside a transmitter portion 2050.

The liquid crystal device 200 disposed inside the case body 2010 is configured so that it is possible to view a display surface (the aforementioned liquid crystal charging region or display region) thereof through a display window 2060.

It should be noted that, although the semiconductor device is mounted on the wiring substrate via the anisotropic conductive film (ACF) in the above-described embodiment, the present invention is not limited to this configuration. It is possible to use various joining methods, such as various kinds of mounting methods used in flip-flop mounting, such as joining with solder or lead-free solder (Ag—Sn, etc.), thermo-compression of like Au members, various metal joining methods such as joining by supersonic vibration, conductive resin joining methods, anisotropic conductive paste (ACP) joining methods, and insulating resin joining methods such as NCF (Non-Conductive Film) joining methods and NCP (Non-Conductive Paste) joining methods.

The electro-optical device and electronic device of the invention are not limited to the examples illustrated and can be variously modified within a range that does not deviate from the gist of the invention. For example, the liquid crystal panel illustrated in each of the above embodiments can also be applied to a liquid crystal device of a passive matrix type or to an active matrix liquid crystal device using an active element such as a TFT (Thin Film Transistor) or a TFD (Thin Film Diode).

Although description was given in the aforementioned embodiments of a case where the invention was applied to a liquid crystal device as the electro-optical device, the present invention is not limited to this. The invention can be applied to various kinds of electro-optical devices such as electro-luminescence devices, particularly organic electro-luminescence devices and inorganic electro-luminescence devices, plasma display devices, FED (Field Emission Display) devices, surface-conduction electron-emitter display, LED (light-emitting diode) display devices, electrophoretic display devices, small televisions using a thin cathode ray tube or liquid crystal shutter, and devices using digital micro-mirror devices (DMD).

Effects of the Invention

As described above, according to the invention, the reliability of conductively joined portions in a mounting structure of a semiconductor device can be improved even if the number of wirings and the number of electrodes increase and wiring intervals and electrode intervals are narrowed.

The entire disclosure of Japanese Patent Application Nos. 2002-240776 filed Aug. 21, 2002 and 2003-197276 filed Jul. 15, 2003 are incorporated by reference.

What is claimed is:

1. A semiconductor device mounting structure including a semiconductor device having an electrode and a substrate having a wiring terminal that is conductively connected to the electrode, wherein
   a first electrode pad is mounted to the semiconductor device and covered by the electrode;
   a second electrode pad is mounted to the semiconductor device and covered by the electrode;
   a width of the wiring terminal is smaller than a width of the electrode;
   a recessed portion is formed in a center portion of the electrode, the recessed portion is constituted by a dimension corresponding to the width of the wiring terminal, the recessed portion is opposite to an interval between the first electrode pad and the second electrode pad; and
   the wiring terminal is embedded in a surface of the electrode.

2. An electro-optical device comprising:
   an electro-optical panel retaining an electro-optical substance;
   a wiring substrate including a wiring terminal conductively connected to the electro-optical panel; and
   a semiconductor device including an electrode conductively connected to the wiring terminal;
   wherein:
      a first electrode pad is mounted to the semiconductor device and covered by the electrode;
      a second electrode pad is mounted to the semiconductor device and covered by the electrode;
      a width of the wiring terminal is smaller than a width of the electrode;
      a recessed portion is formed in the center portion of the electrode, the recessed portion is constituted by a dimension corresponding to the width of the wiring terminal, the recessed portion is opposite to an interval between the first electrode pad and the second electrode pad; and
      the wiring terminal is embedded in a surface of the electrode.

* * * * *